(12) United States Patent
Terada et al.

(10) Patent No.: US 7,615,288 B2
(45) Date of Patent: *Nov. 10, 2009

(54) CLEANING MEMBER AND CLEANING METHOD

(75) Inventors: Yoshio Terada, Ibaraki (JP); Eiji Toyoda, Ibaraki (JP); Makoto Namikawa, Ibaraki (JP)

(73) Assignee: Nitto Denko Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/874,310

(22) Filed: Jun. 24, 2004

(65) Prior Publication Data

US 2004/0265594 A1 Dec. 30, 2004

(30) Foreign Application Priority Data

| Jun. 26, 2003 | (JP) | ............... P. 2003-182084 |
| Apr. 22, 2004 | (JP) | ............... P. 2004-126304 |

(51) Int. Cl.
*B32B 27/06* (2006.01)
*B32B 27/34* (2006.01)
*B32B 33/00* (2006.01)

(52) U.S. Cl. .................. 428/473.5; 428/446

(58) Field of Classification Search .......... 428/411.1, 428/355 AC, 473.5
See application file for complete search history.

(56) References Cited

U.S. PATENT DOCUMENTS

| 3,684,818 | A | * | 8/1972 | Netherwood | 174/527 |
| 3,727,865 | A | * | 4/1973 | Melrose et al. | 248/632 |
| 4,075,420 | A | * | 2/1978 | Walton | 174/251 |
| 4,255,630 | A | * | 3/1981 | Hire et al. | 200/81.4 |
| 4,318,071 | A | * | 3/1982 | Shepherd | 337/136 |
| 4,530,993 | A | * | 7/1985 | Jinda et al. | 528/353 |
| 4,894,497 | A | * | 1/1990 | Lycan | 200/83 R |
| 5,115,077 | A | * | 5/1992 | Matsuo et al. | 528/125 |
| 5,593,774 | A | * | 1/1997 | Hiroe et al. | 428/343 |
| 5,902,678 | A |  | 5/1999 | Konda et al. |  |
| 6,165,612 | A | * | 12/2000 | Misra | 428/344 |
| 6,272,687 | B1 | * | 8/2001 | Cunningham | 2/161.7 |
| 6,741,082 | B2 |  | 5/2004 | Ono |  |
| 6,821,620 | B2 | * | 11/2004 | Namikawa et al. | 428/355 AC |
| 2003/0136430 | A1 |  | 7/2003 | Namikawa et al. |  |
| 2004/0000149 | A1 | * | 1/2004 | Kirkconnell et al. | 62/6 |
| 2005/0089708 | A1 | * | 4/2005 | Maruko et al. | 428/611 |

FOREIGN PATENT DOCUMENTS

| EP | 0 976 802 A1 | 2/2000 |
| EP | 1 286 792 A1 | 3/2003 |
| JP | 62-16284 A | 1/1987 |
| JP | 2-177125 A | 7/1990 |
| JP | 8-115897 A | 5/1996 |
| JP | 10-154686 A | 6/1998 |
| JP | 2000-312862 A | 11/2000 |
| JP | 2001-198075 | 7/2001 |
| JP | 2003-68810 A | 3/2003 |
| WO | WO 01/94036 A1 | 12/2001 |
| WO | WO 0205975 A1 * | 1/2002 |
| WO | WO 03/060175 A1 * | 7/2003 |

OTHER PUBLICATIONS

MatWeb Online Material Data Sheet—DuPont Kapton 100HN Polyimide Film.*
European Search Report dated Oct. 6, 2004.
First Office Action, The Patent Office of the People's Republic of China, App. No. 2004100552094, Mar. 30, 2007.
Japanese Office Action for JPA No. 2004-126304 dated Jun. 2, 2009.

* cited by examiner

*Primary Examiner*—Ramsey Zacharia
(74) *Attorney, Agent, or Firm*—Sughrue Mion, PLLC

(57) ABSTRACT

A cleaning sheet which comprises a cleaning layer having a tensile stress at 10% strain of from 0.3 to 3,000 N/mm$^2$ or a carrying member with a cleaning function wherein at least one side of the carrying member has a cleaning layer having a tensile stress at 10% strain of from 0.3 to 3,000 N/mm$^2$, particularly, a cleaning sheet or a carrying member with a cleaning function of the aforementioned constructions, wherein the aforementioned cleaning layer comprises a resin layer having been hardened by an active energy source or a polymer resin having heat resistance.

3 Claims, No Drawings

CLEANING MEMBER AND CLEANING METHOD

FIELD OF THE INVENTION

This invention relates to a member for cleaning various substrate processing equipments which dislike foreign matter, a method for cleaning the aforementioned substrate processing equipment using the same, and the aforementioned substrate processing, equipment cleaned by this method.

BACKGROUND OF THE INVENTION

In various substrate processing equipments which dislike foreign matter, such as production devices and inspection devices of semiconductors, flat panel displays, printed wiring boards and the like, substrates are carried while physically contacting with respective carrying systems. In that case, when a foreign substance is adhered to a substrate or carrying system, it stains the succeeding substrates one by one so that it is necessary to carry out a cleaning treatment by periodically stopping the apparatus. Thus, there was a problem of reducing the working ratio and requiring considerable labor.

For the purpose of solving this problem, a method has been proposed in which foreign substances adhered to the inside of a substrate processing equipment are cleaned and removed by carrying an adhesive material-fixed substrate as a cleaning member into the aforementioned device (cf. Patent Reference 1).

[Patent Reference 1]
JP-A-10-154686 (pages 2-4)

SUMMARY OF THE INVENTION

The aforementioned proposed method is an effective method for avoiding reduction of the working ratio and requirement of considerable labor, because it is not necessary to carry out a washing treatment by stopping the apparatus. In this method however, the substrate cannot be carried securely in some cases because of its aptness to peel off due to too strong adhesion of the adhesive material to the contacting region of the device, so that the foreign substances inside the device cannot be cleaned and removed as a result.

In view of such circumstances, the invention contemplates providing a cleaning member which can conveniently and securely remove foreign matter adhered to the inside of various substrate processing equipments by securely carrying it into the devices, and a method for cleaning the substrate processing equipment using the same.

The present inventors have conducted intensive studies on the aforementioned objects and found as a result that a cleaning member can be carried into various substrate processing equipments securely without causing problems such as too strong adhesion to the contacting region of the device, and the foreign matter inside the device can therefore be removed conveniently and securely, when a cleaning layer constituting the cleaning member is constructed from a resin layer hardened by an active energy source or a polymer resin having heat resistance and its tensile stress at 10% strain is set within a specified range.

The invention has been accomplished based on such a finding. In other words, the invention has the following constitutions.

(1) A cleaning sheet comprising a cleaning layer having a tensile stress at 10% strain of from 0.3 to 3,000 N/mm$^2$.

(2) The cleaning sheet according to the above (1), wherein the cleaning layer comprises a resin layer having been hardened by an active energy source.

(3) The cleaning sheet according to the above (1), wherein the cleaning layer comprises a polymer resin having heat resistance.

(4) The cleaning sheet according to any one of the above (1) to (3), which further comprises a support, and wherein said cleaning layer is provided on at least one side of the support.

(5) The cleaning sheet according to any one of the above (1) to (3), which further comprises a support and an adhesive layer, wherein said cleaning layer is provided on one side of the support and said adhesive layer is provided on the other side of the support.

(6) A carrying member with a cleaning function, which comprises a carrying member and a cleaning layer provided on at least one side of the carrying member, wherein the cleaning layer has a tensile stress at 10% strain of from 0.3 to 3,000 N/mm$^2$.

(7) The carrying member with a cleaning function according to the above (6), wherein the cleaning layer comprises a resin layer having been hardened by an active energy source (8) The carrying member with a cleaning function according to the above (6), wherein the cleaning layer comprises a polymer resin having heat resistance.

(9) A carrying member with a cleaning function, which comprises a carrying member and a adhesive layer, wherein the cleaning sheet according to any one of the above (1) to (5) is provided on at least one side of the carrying member through the adhesive layer.

(10) A cleaning method, which comprises carrying the cleaning sheet according to any one of the above (1) to (4) or the carrying member with a cleaning function according to any one of the above (6) to (9), allowing the cleaning sheet according to any one of the above (1) to (4) or the carrying member with a cleaning function according to any one of the above (6) to (9) to contact with a region to be washed.

(11) A substrate processing equipment cleaned by a cleaning method according to the above (10).

Thus, the invention can provide a cleaning member which can be carried into a substrate processing equipment without causing a trouble such as too strong adhesion to the region therein to be washed and can thereby remove foreign matter inside the device conveniently and securely, effected by setting a tensile stress at 10% strain of the cleaning layer within the range of from 0.3 to 3,000 N/mm$^2$, and a cleaning method which uses the same.

DETAILED DESCRIPTION OF THE INVENTION

According to the cleaning member of the invention, it is necessary that the cleaning layer has its tensile stress at 10% strain of within the range of from 0.3 to 3,000 N/mm$^2$, preferably within the range of from 1 to 1,000 N/mm$^2$, more preferably with in the range of from 5 to 500 N/mm$^2$, most preferably within the range of from 10 to 100 N/mm$^2$.

By setting it within such a range, foreign matter can be removed conveniently and securely without causing carrier troubles. When the tensile stress at 10% strain exceeds 3,000 N/mm$^2$, performance of the carrier system to remove adhered foreign matter is reduced, and when it is less than 0.3 N/mm$^2$ it is apt to cause a carrier trouble by adhering to the region to be washed inside the equipment during carrying.

In this connection, the term "tensile stress at. 10% strain" as used herein means a value measured in accordance with a test method JIS K7127.

Such a cleaning layer is not particularly limited regarding its material and the like, but it is desirable that its typical example is constructed from a resin layer hardened by an ultraviolet lay, heat or the like active energy source. Since the molecular structure of this resin layer becomes a three-dimensional network structure by hardening reactions including a crosslinking reaction, and its tensile stress at the time of strain therefore becomes large, the tensile stress at the time of strain can be easily set within the aforementioned range by appropriately controlling the aforementioned reactions.

In addition, though its adhesive strength is reduced by the aforementioned three-dimensional network structure formation, the adhesive strength becomes 0.2 N (20 g)/10 mm width or less, preferably from about 0.01 to about 0.1 N/10 mm width, as a 180° peel adhesive strength based on the silicon water (mirror side), when the tensile stress at the time of strain is set within the aforementioned range. When the adhesive strength becomes larger than the above range, it is apt to cause a carrier trouble by adhering to the region to be washed inside the device during carrying.

Examples of the resin layer having been hardened by an active energy source include those in which hardening type resin compositions prepared by mixing a pressure sensitive adhesive polymer with a compound having one or two or more unsaturated double bonds in the molecule (to be referred to as polymerizable unsaturated compound hereinafter) and a polymerization initiator, as well as crosslinking agent and the like as occasion demands, are hardened by an active energy source, particularly ultraviolet rays.

Preferred as the pressure sensitive adhesive polymer are acrylic polymers having a (meth)acrylic and/or (meth)acrylic ester as the main monomers.

In synthesizing an acrylic polymer, unsaturated double bonds may be introduced into the acrylic polymer molecule, by using a compound having two or more unsaturated double bonds in the molecule as a copolymerization monomer, or by allowing a compound having an unsaturated double bonds in the molecule to bind to the acrylic polymer after its synthesis through a reaction between functional groups. By this introduction, the acrylic polymer by itself can also be concerned in the polymerization hardening reaction by the active energy source.

As the polymerizable unsaturated compound, a nonvolatile and low molecular compound having a weight average molecular weight of 10,000 or less is desirable, and a compound having a weight average molecular weight of 5,000 or less is particularly desirable in view of efficiently forming a three-dimensional network structure at the time of the hardening.

Examples of such a polymerizable compound include phenoxy polyethylene glycol (meth)acrylate, ε-caprolactone (meth)acrylate, polyethylene glycol di(meth)acrylate, polypropylene glycol di(meth)acrylate, trimethylolpropane tri(meth)acrylate, dipentaerythritol hexa(meth)acrylate, urethane (meth)acrylate, epoxy (meth)acrylate, oligo-ester (meth)acrylate and the like, and one or two more among them are used.

As the polymerization initiator, when heat is used as the active energy source for example, benzoyl peroxide, azobisisobutyronitrile or the like heat polymerization initiator is used. Also, when light is used as the active energy source, benzoyl, benzoin ethyl ether, dibenzyl, isopropyl benzoin ether, benzophenone, Michler's ketone chlorothioxanthone, dodecylthioxanthone, dimethylthioxanthone, acetophenone diethyl ketal, benzyl dimethyl ketal, α-hydroxycyclohexyl phenyl ketone, 2-hydroxymethylphenylpropane, 2,2-dimethoxy-2-phenylacetophenone or the like photo-polymerization initiator is used.

In addition to the aforementioned resin layer hardened by an active energy source, it is desirable also to use a polymer resin having heat resistance in the cleaning layer of the invention.

Though such a polymer resin is not particularly limited so far as it has heat resistance, for example, a polyimide resin obtained by heat imidation of a polyamic acid resin having a structural unit represented by the following formula (1) [in the formula (1), n and m are integers of 0 or more, but one of n and m is an integer of 1 or more] in its principal chain is suitably used.

<Structural Unit Represented by Formula (1)>

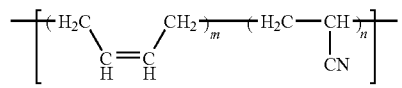

The aforementioned polyamic acid resin can be obtained by allowing a tetracarboxylic acid dianhydride component to react with a diamine component at the substantially equivalent molar ratio in an appropriate organic solvent.

Examples of the tetracarboxylic acid dianhydride component include 3,3',4,4'-biphenyltetracarboxylic acid dianhydride, 2,2',3,3'-biphenyltetracarboxylic acid dianhydride, 3,3',4,4'-benzophenonetetracarboxylic acid dianhydride, 2,2',3,3'-benzophenonetetracarboxylic acid dianhydride, 4,4'-oxydiphthalic acid dianhydride, 2,2-bis(2,3-dicarboxyphenyl)hexafluoropropane dianhydride, 2,2-bis(3,4-dicarboxyphenyl)hexafluoropropane dianhydride (6FDA), bis(2,3-dicarboxyphenyl)methane dianhydride, bis(3,4-dicarboxyphenyl)methane dianhydride, bis(2,3-dicarboxyphenyl)sulfone dianhydride, bis(3,4-dicarboxyphenyl)sulfone dianhydride, pyromellitic acid dianhydride, ethylene glycol bistrimellitic acid dianhydride and the like, which maybe used alone or as a mixture of two or more.

In addition, as the aforementioned diamine component, a diamine having the aforementioned structure represented by the formula (1), such as an aliphatic diamine represented by the following formula (2) or (3) [in both formulae, n and m are integers of 0 or more, but one of n and m is an integer of 1 or more], is used, and such a diamine may be used alone or as a mixture with other diamine.

<Aliphatic Diamine Represented by Formula (2)>

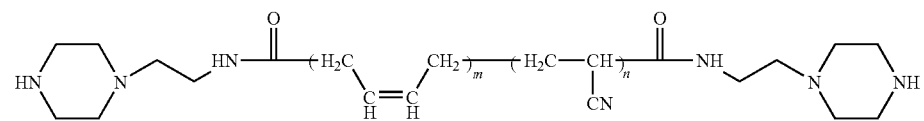

<Aliphatic Diamine Represented by Formula (3)>

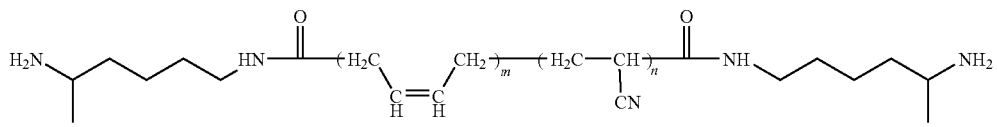

Examples of the aforementioned diamine to be used jointly include diamines such as 4,4'-diaminodiphenyl ether, 3,4'-diaminodiphenyl ether, 3,3'-diaminodiphenyl ether, m-phenylenediamine, p-phenylenediamine, 4,4'-diaminodiphenylpropane, 3,3'-diaminodiphenylpropane, 4,4'-diaminodiphenylmethane, 3,3'-diaminodiphenylmethane, 4,4'-diaminodiphenyl sulfide, 3,3'-diaminodiphenyl sulfide, 4,4'-diaminodiphenylsulfone, 3,3'-diaminodiphenylsulfone, 1,4-bis(4-aminophenoxy)benzene, 1,3-bis(4-aminophenoxy)benzene, 1,3-bis(3-aminophenoxy)benzene, 1,3-bis(4-aminophenoxy)-2,2-dimethylpropane, 4,4'-diaminobenzophenone, 1,3-bis(3-aminopropyl)-1,1,3,3-tetramethyldisiloxane and the like.

The aforementioned tetracarboxylic acid dianhydride and diamine can be reacted with each other at the substantially equivalent molar ratio in an appropriate organic solvent, and when a diamine having the structure represented by formula (1) is used, gelation can be prevented by carrying out the reaction at a temperature of 100° C. or more.

When they are polymerized at a temperature of lower than this, the gel component may remain in the reaction system depending on the used amount of the aforementioned diamine, and the residue sometimes causes a difficulty in removing foreign matter by filtration doe to its clogging. Also, since the reaction becomes heterogeneous, it sometimes becomes the cause of generating irregularity in the characteristics of the resin.

In addition, N,N-dimethylacetamide, N-methyl-2-pyrrolidone, N,N-dimethylformamide and the like can be exemplified as the appropriate solvent for carrying out reaction of the aforementioned tetracarboxylic acid dianhydride and diamine, and toluene, xylene or the like non-polar solvent may be optionally mixed therewith and used for adjusting solubility of the materials and resin.

The polyimide resin to be used in the invention can be obtained by carrying out heat imidation of the polyamic acid resin obtained by the aforementioned method.

Regarding the method for effecting heat imidation, the imidation may be carried out in a solvent by an azeotropic dehydration method after mixing a solution of the aforementioned polyamic acid with toluene, xylene or the like solvent which is azeotropic with water, or the imidation may be effected by applying the mixture on a substrate, drying the solvent and then carrying out a heat treatment.

Also, examples of the polymer resin having heat resistance include ladder polymers such as phenyl-T, polyquinoxaline, polybenzoylene benzimidazole and the like and aromatic polymers such as polyphenylene, polyamide, polyester imide, polybenzimidazole, polycarbodiimide, alamide and the like, in addition to the aforementioned polyimide resin.

Among these polymer resins having heat resistance, polyimide resin, polyamide and polycarbodiimide are particularly desirable as the cleaning layer in terms that they do not generate volatile gases and decomposed monomers even when exposed to a high temperature of 400° C. or more.

Regarding the cleaning member of the invention in which its cleaning layer is constructed using such a polymer resin having heat resistance, this cleaning member has an advantage in that it can be used without generating carrier failure and pollution inside the treating devices at the time of its carrying even when it is used in substrate processing equipments which are used under a high temperature, such as ozone washer, resist coater, oxidation diffusion furnace, ordinary pressure CVD device, reduced pressure CVD device and plasma CVD device.

Such a cleaning layer comprising a polymer resin having heat resistance can be formed in response to the respective embodiment of cleaning member which will be described later, by applying on a release paper, a heat resistant support (polyethylene terephthalate film, polyimide film or the like) or a carrying member (generally via a release layer) by an appropriate method such as a spin coat method, a spray method, a comma coat method, a fountain method, a gravure method, drying the solvent and then heat-treating at a high temperature.

It is desirable that the aforementioned heat-treating temperature is set to 200° C. or more, and it is desirable to carry out the treatment in an inert atmosphere such as in an atmosphere of nitrogen or under vacuum, in order to prevent oxidation deterioration of the resin. By this treatment, volatile components remained in the resin can be completely removed.

According to the invention, the aforementioned cleaning layer comprising a resin layer hardened by an active energy source or a polymer resin having heat resistance can be made into a cleaning sheet by forming this layer alone into a sheet or tape.

Also, in that case, a cleaning sheet can be prepared by using a support and arranging the aforementioned cleaning layer on at least one side of this support. Though thickness of the cleaning layer in this case is not particularly limited, it is generally from 5 to 100 μm.

Though the support is not particularly limited, its examples include plastic films of polyethylene, polypropylene and the like polyolefin resins, polyethylene terephthalate, acetyl cellulose, polycarbonate, polyimide, polyamide and the like. It is desirable that thickness of the support is generally from 10 to 100 μm.

According to the invention, foreign matter adhered to a region to be washed can be cleaned and removed conveniently and securely, by using a cleaning sheet having the aforementioned construction directly as a cleaning member, and carrying this into various substrate processing equipments to allow it to contact with the aforementioned region.

In addition, a cleaning sheet having the aforementioned construction can be made into a carrying member with a cleaning function, by applying it on at least one side of a carrying member through an adhesive layer. That is, foreign matter adhered to a region to be washed can be cleaned and removed conveniently and securely, by using this carrying member with a cleaning function as a cleaning member, and carrying this into various substrate processing equipments to allow it to contact with the aforementioned region in the same manner as in the above.

Such a carrying member with a cleaning function can be produced by applying a cleaning sheet having the aforementioned construction on a carrying member using a usual adhesive of an acrylic, rubber or the like system. In order to facilitate this production, it is desirable to prepare in advance a cleaning sheet having a cleaning layer of the aforementioned construction on one side of a support and the aforementioned usual adhesive layer on the other side, and apply this on the carrying member through the aforementioned adhesive layer.

In the cleaning sheet having the aforementioned construction, it is desirable that the adhesive layer to be arranged on the other side of the support has a thickness of generally from 5 to 100 µm. Also, in case that the carrying member is recycled by peeling from the adhesive layer after cleaning of a substrate processing equipment, it is desirable that adhesive strength of the adhesive layer is from 0.21 to 0.98 N/10 mm width, preferably from 0.4 to 0.98 N/10 mm width, as a 180° peel adhesive strength based on the silicon wafer (mirror side)

When within this range, it can be easily re-peeled after cleaning without causing peeling during its carrying.

In addition to its production by laminating a cleaning sheet on a carrying member as described in the foregoing, the carrying member with a cleaning function to be used as a cleaning member in the invention can also be produced by arranging a cleaning layer having the aforementioned construction directly on at least one side of the carrying member. That is, the cleaning layer may be formed by a method in which the aforementioned hardening type resin composition or polymer resin having heat resistance for constructing a cleaning layer is applied and then hardened by an active energy source or heat-treated at a high temperature after drying.

According to the carrying member of the invention with a cleaning function, the carrying member is not particularly limited, and various substrates can be used in response to the kind of substrate processing equipment as the target for removing foreign matter. Its illustrative examples include semiconductor wafer, LCD, PDP and the like substrates for flat panel display use, as well as substrates of compact disc, MR head and the like.

In addition, the substrate processing equipment to be subjected to the cleaning of the invention is not particularly limited, and its examples include an exposure irradiation device for circuit formation, a resist coating device, a spattering device, an ion injection device, a dry etching device, a wafer prober and the like various production apparatus and inspection apparatus.

According to the invention, it can provide the aforementioned various substrate processing equipments cleaned by the aforementioned method.

EXAMPLES

Next, the invention is described more illustratively with reference to examples. However, the invention is not limited to these examples. In this connection, the term "part(s)" as used in the following means part(s) by weight.

Example 1

An ultraviolet ray hardening type resin solution was prepared by uniformly mixing 100 parts of an acrylic polymer having a weight average molecular weight of 700,000, which had been synthesized using a monomer mixture comprising 75 parts of 2-ethylhexyl acrylate, 20 parts of methyl acrylate and 5 parts of acrylic acid, with 50 parts of polyethylene glycol dimethacrylate and 50 parts of urethane acrylate as polymerizable unsaturated compounds, 3 parts of benzyl dimethyl ketal as a photo-polymerization initiator and 3 parts of diphenylmethane diisocyanate as a crosslinking agent.

In addition, a non-hardening type resin solution was prepared in the same manner as described in the above, except that 3 parts of benzyl dimethyl ketal was excluded from this resin solution.

Firstly, a usual adhesive layer was arranged on one side of a support comprising a polyester film of 250 mm in width and 25 µm in thickness, by applying the aforementioned non-hardening type resin solution thereto to a thickness after drying of 10 µm and subsequently drying the solution, and then pasting a polyester release film having a thickness of 38 µm to its surface.

Next, a resin layer was arranged on the other side of the support by applying the aforementioned ultraviolet ray hardening type resin solution to a thickness after drying of 40 µm and subsequently drying the solution, and then pasting the same polyester release film described in the above to its surface.

By arranging a resin layer on one side of a support and a usual adhesive layer on the other side in this manner, and irradiating this with an ultraviolet ray having a central wavelength of 365 nm in an integrated quality of light of 1,000 mJ/cm$^2$, a cleaning layer in which the aforementioned resin layer was polymerization-hardened was formed.

Regarding the cleaning sheet prepared in this manner, tensile stress at 10% strain of the cleaning layer comprising the polymerization-hardened resin layer was measured to find that it was 25 N/10 mm$^2$.

A carrying member having cleaning function was prepared by pealing off the release film of the usual adhesive layer side of this cleaning sheet and applying the sheet to the backside (mirror side) of an 8 inch silicon wafer as a carrying member.

Separately from this, three wafer stages of a substrate processing equipment were detached and foreign substances of 0.3 µm or more were measured using a laser foreign matter analyzer to find that one had 25,000 substances, another one had 22,000 substances and the other one 23,000, within the area of the 8 inch wafer size.

Next, when the aforementioned carrying member having cleaning function was used as the cleaning member and, after peeling off the release film on its cleaning layer side, carried into a substrate processing equipment having the aforementioned wafer stage to which 25,000 foreign substances were adhered, it was able to carry it without problems. Thereafter, when the wafer stage was detached and foreign substances of 0.3 µm or more were measured using the laser foreign matter analyzer, they were 6,200 within the 8 inch wafer size, so that it was able to remove ¾ or more of the foreign substances adhered thereto before the cleaning.

Comparative Example 1

A cleaning sheet was prepared in the same manner as in Inventive Example 1, except that the ultraviolet ray having a central wavelength of 365 nm was irradiated in an integrated quality of light of 5 mJ/cm$^2$. Tensile stress at 10% strain of the cleaning layer was 0.13 N/10 mm$^2$.

When a carrying member having cleaning function was prepared in the same manner as in Inventive Example 1 using this cleaning sheet and carried into a substrate processing equipment having the aforementioned wafer stage to which 22,000 foreign substances were adhered, it was fixed to the wafer stage so that it could not be carried.

Comparative Example 2

A cleaning sheet was prepared in the same manner as in Inventive Example 1, except that the ultraviolet ray having a central wavelength of 365 nm was irradiated in an integrated quality of light of 2,000 mJ/cm$^2$. Tensile stress at 10% strain of the cleaning layer was 3,500 N/10 mm$^2$.

When a carrying member having cleaning function was prepared in the same manner as in Example 1 using this cleaning sheet and carried into a substrate processing equipment having the aforementioned wafer stage to which 23,000 foreign substances were adhered, they were 20,000 within the 8 inch wafer size, so that the foreign substances adhered before the cleaning could hardly be removed.

While the invention has been described in detail and with reference to specific embodiments thereof, it will be apparent to one skilled in the art that various changes and modifications can be made therein without departing from the spirit and scope thereof.

The present application is based on Japanese Patent Application 2003-182084, filed on Jun. 26, 2003, and Japanese Patent Application 2004-126304, filed on Apr. 22, 2004, and the entire disclosure thereof are incorporated herein by reference in its entirety.

What is claimed is:

1. A carrying member with a cleaning function, which comprises a carrying member and a cleaning layer provided on at least one side of the carrying member, wherein the cleaning layer has a tensile stress at 10% strain of from 0.3 to 100 N/mm$^2$ according to JIS K7127, wherein the cleaning layer comprises an aromatic polyimide having heat resistance, and wherein the carrying member is a semiconductor wafer.

2. A carrying member with a cleaning function, which comprises a carrying member, an adhesive layer, and a cleaning layer provided on at least one side of the carrying member through the adhesive layer, wherein the cleaning layer has a tensile stress at 10% strain of from 0.3 to 100 N/mm$^2$ according to JIS K7127, wherein the cleaning layer comprises an aromatic polyimide having heat resistance, and wherein the carrying member is a semiconductor wafer.

3. A cleaning method, which comprises carrying a carrying member having a cleaning function comprising a cleaning layer provided on at least one side of the carrying member, wherein the cleaning layer has a tensile stress at 10% strain of from 0.3 to 100 N/mm$^2$ according to JIS K7127, wherein the cleaning layer comprises an aromatic polyimide having heat resistance, and wherein the carrying member is a semiconductor wafer, and
allowing the cleaning layer to contact a region to be washed.

* * * * *